(12) United States Patent  
Park et al.

(10) Patent No.: US 8,003,198 B2  
(45) Date of Patent: Aug. 23, 2011

(54) FLEXIBLE PRINTED CONDUCTIVE FABRIC AND METHOD FOR FABRICATING THE SAME

(75) Inventors: Sung Mee Park, Atlanta, GA (US); Kwang Su Cho, Gyeonggi-do (KR); Kyung Hee Chung, Seoul (KR)

(73) Assignee: Kolon Glotech, Inc., Gyeonggi-do (KR)

( * ) Notice: Subject to any disclaimer, the term of this patent is extended or adjusted under 35 U.S.C. 154(b) by 78 days.

(21) Appl. No.: 11/997,766

(22) PCT Filed: Nov. 14, 2007

(86) PCT No.: PCT/KR2007/005719  
§ 371 (c)(1), (2), (4) Date: Feb. 4, 2008

(87) PCT Pub. No.: WO2008/060101  
PCT Pub. Date: May 22, 2008

(65) Prior Publication Data  
US 2010/0279086 A1    Nov. 4, 2010

(30) Foreign Application Priority Data

Nov. 14, 2006 (KR) .................. 10-2006-0112274  
Jul. 12, 2007 (KR) .................. 10-2007-0070173

(51) Int. Cl.  
*B41M 5/00* (2006.01)  
*B44C 1/17* (2006.01)  
*G03G 7/00* (2006.01)

(52) U.S. Cl. .......... 428/195.1; 428/201; 428/213; 428/292.4; 428/297.4; 428/412; 428/413; 428/421; 428/423.1; 428/446; 428/457; 428/458; 428/480; 428/500; 442/59; 442/181; 174/254; 361/751

(58) Field of Classification Search .......... 428/195.1, 428/201, 213, 292.4, 297.4, 412, 413, 421, 428/423.1, 446, 457, 458, 480, 500; 442/59, 442/181; 174/254; 361/751  
See application file for complete search history.

(56) References Cited

U.S. PATENT DOCUMENTS

| | | | |
|---|---|---|---|
| 4,851,613 A * | 7/1989 | Jacques | 174/254 |
| 6,395,121 B1 | 5/2002 | De Bastiani | |
| 6,447,886 B1 | 9/2002 | Mohamed et al. | |
| 2005/0045358 A1* | 3/2005 | Arnold | 174/51 |
| 2005/0173701 A1* | 8/2005 | Kawase et al. | 257/40 |

FOREIGN PATENT DOCUMENTS

| | | |
|---|---|---|
| KR | 10-2005-0092461 A | 9/2005 |
| KR | 20-0402130 | 11/2005 |
| KR | 10-2006-0084674 A | 7/2006 |

* cited by examiner

*Primary Examiner* — Betelhem Shewareged  
(74) *Attorney, Agent, or Firm* — Sughrue Mion, PLLC

(57) ABSTRACT

A conductive fabric is provided. The conductive fabric comprises a base layer composed of a synthetic, regenerated or natural fiber, a conductive layer formed on the base layer to be capable of being freely formed by a pre-designed electric pattern, and an insulating layer formed on the conductive layer to protect the conductive layer from damage.

36 Claims, 13 Drawing Sheets

FLEXIBLE PRINTED CONDUCTIVE FABRIC AND METHOD FOR FABRICATING THE SAME

TECHNICAL FIELD

The present invention relates to a flexible printed conductive fabric (hereinafter, referred to simply as a 'conductive fabric') and a method for fabricating the conductive fabric, and more particularly to a conductive fabric in which a conductive circuit pattern can be formed in a free or arbitrary manner, and a method for fabricating the conductive fabric.

BACKGROUND ART

Smart wear is a new type of product that is designed to apply a new fiber technology for signal transmission to and embed various digital devices in a textile fashion product to utilize the digitalized properties of the digital devices anytime and anywhere. That is, smart wear is a new type of clothing that is manufactured by providing desired digitalized properties to a fiber material or clothing while maintaining the nature of the fiber material or clothing. Accordingly, smart wear is required to transmit digital signals while producing a tactile feeling and physical properties identical to general textiles. In conclusion, smart wear refers collectively to a new concept of clothing that combines high-function material properties (e.g., sensing of external stimuli and self-response to the stimuli) of fibers or clothes with digitalized properties, which are not found in clothes and textiles.

Smart wear has been developed for military applications since the mid-1990's and is currently being developed in various fields, particularly clothing and medical applications. In particular, smart materials based on electronic printing technology can be used to manufacture military textile products for wearable computers. Textile-based electronic circuits can be designed by applying electronic printing technology to smart materials in such a way that conductive fibers or textiles having characteristics and electrical properties of clothing are connected to various electronic components and parts ('interconnection method'). Therefore, electronic printing technology is of great value in the development of smart wear. For example, the application of electronic printing technology to military uniforms offers the possibility to reduce the weight and volume of the military uniforms, thus enabling the development of military uniforms integrated with desired functions, such as injury healing and communication. Soldiers must still carry as much as 45 kg of equipment when fully armed for modern high-tech warfare. Under such circumstances, it is an urgent demand to develop a suitable technology associated with a combination of various factors for a body area network (BAN) to manufacture smart wear.

To meet this demand, various proposals have been made. For example, insulated electric wires, electrically conductive metallic yarns or insulating spun yarns are used to weave textiles. The conductivity of the textiles is determined by the number and size of the metallic yarns or spun yarns.

The problem associated with the attachment of the insulated electric wires to final clothing is that another finishing process must be involved to attach/insulate the insulated electric wires. The additional finishing process requires an increase in production cost. Further, the continuous wearing of the clothing causes disconnection of the insulated electric wires, which makes it difficult to exhibit the inherent functions of the clothing.

PCT International Publication No. WO 2004/107831 suggests a fiber construction comprising one or more conductive fibers and one or more non-conductive fibers cooperating with said one or more conductive fibers to fashion at least one fabric interface wherein said non-conductive fibers provide elasticity to the fiber construction such that said at least one fabric interface is selectively revealed and/or can be accessed coincident with an extension of the fiber construction.

Further, PCT International Publication No. WO 2003/095729 suggests a multilayer woven article having an electronic function woven therein comprising: warp yarn and weft yarn interwoven in a multilayer weave having plural layers defining at least one cavity therebetween; at least one electrically conductive yarn disposed in the warp and/or in the weft and having a portion thereof in one of the plural layers defining the at least one cavity; and a circuit carrier disposed in the cavity and having at least one exposed electrical contact in electrical connection with said at least one electrically conductive yarn.

Meanwhile, fabrics serving as basic materials of smart wear require the following dynamic wearing characteristics. The physical requirements for wearers and devices include placement of the devices, form language of the devices, human movement, human perception of an intimate space, size variation, and attachment of the devices.

Further, in view of the relationship between wearers and ambient atmospheres, containment of the devices, weight of the devices, accessibility, sensory interaction, thermal comfort, aesthetics, long-term effects, etc. are considered [Gemperle, F.; Kasabach, C.; Stivoric, J.; Bauer, M.; Martin, R.; (1998) "Design for Wearability," Digest of Papers, 2nd International Symposium of Wearable Computer, IEEE Computer Society].

In this connection, it is difficult to design the proposed electrically conductive textiles for smart wear so as to correspond to the placement and form of electronic devices. In other words, no alternative can be provided in view of the physical requirements for wearers and devices. Further, the proposed fabrics suffer from great limitations in fiber volume, washing characteristics, etc. from the viewpoint of the maintenance of the inherent nature of the fibers.

DISCLOSURE

Technical Problem

The present invention has been made in an effort to solve the above problems, and it is one object of the present invention to provide a conductive fabric in which a circuit can be freely formed without any restriction to dynamic wearability, and a method for fabricating the conductive fabric.

It is another object of the present invention is to provide a conductive fabric in which a circuit can be freely designed regardless of the form or placement of an electronic device, and a method for fabricating the conductive fabric.

It is another object of the present invention is to provide a conductive fabric that is free from any defect or circuit failure by circuit disconnection, and a method for fabricating the conductive fabric.

It is another object of the present invention is to provide a conductive fabric that exhibits satisfactory electrical properties without deteriorating the intrinsic physical properties of a textile usable as a material for clothing, and a method for fabricating the conductive fabric.

It is another object of the present invention is to provide a fabric in which one or more bent portions of a circuit are designed to be modified to allow electricity to smoothly flow, and a method for fabricating the conductive fabric.

It is still another object of the present invention is to provide a washable conductive fabric and a method for fabricating the conductive fabric.

Technical Solution

In accordance with one aspect of the present invention for accomplishing the above objects, there is provided a conductive fabric comprising a base layer composed of a synthetic, regenerated or natural fiber, a conductive layer formed on the base layer to be capable of being freely formed by a pre-designed electric pattern, and an insulating layer formed on the conductive layer to protect the conductive layer from damage.

The conductive fabric may further comprise a primer layer formed between the base layer and the conductive layer to make the surface of the base layer uniform.

The primer layer may be formed of at least one resin selected from the group consisting of polyurethane, acrylic and silicone resins.

The primer layer may be formed in a multilayer structure with a water-repellent layer.

The conductive layer may be formed of at least one material selected from the group consisting of a conductive polymer, carbon, a metal material such as silver, and a mixture thereof with a binder.

The conductive polymer may be selected from the group consisting of polyaniline, polypyrrole, polythiophene, and mixtures thereof. The metal material and the binder may be mixed in a weight ratio of 90:10 to 80:20 to form the conductive layer.

The binder may be selected from the group consisting of polyurethane resins, acrylic resins, silicone resins, melamine resins, epoxy resins, and mixtures thereof.

The binder may be a water-dispersible polyurethane resin.

The conductive layer may have a thickness of 2 μm to 500 μm.

The conductive layer may have a thickness of 10 μm to 20 μm.

The conductive layer may have a width of 10 mm to 20 mm.

The insulating layer may be formed by coating, printing or laminating at least one resin selected from the group consisting of polyurethane, acrylic, silicone, polyester, polyvinyl chloride (PVC) and polytetrafluoroethylene (PTFE) resins on the conductive layer.

The conductive layer may have one or more the enlarged portions of bent portions of a circuit whose width is larger than that of linear portions of the circuit.

The enlarged portions may have a circular or oval shape.

The conductive fabric of the present invention may have a resistance difference of 0.5Ω to 4Ω before and after washing.

In accordance with another aspect of the present invention, there is provided a method for fabricating a conductive fabric, the method comprising the steps of forming a conductive layer, through which electricity can flow, on a base layer composed of a synthetic, regenerated or natural fiber, and forming an insulating layer on the conductive layer to protect the conductive layer from damage.

The method may further comprise the step of forming a primer layer on the base layer to maintain the thickness of the conductive layer at a constant level.

The primer layer may be formed in a multilayer structure with a water-repellent layer.

The method of the present invention may further comprise the step of pressurizing (calendering step) the base layer using a pressing roller before the formation of the conductive layer to make the surface of the base layer smooth, make up pores of the base layer and enhance the flex resistance of the conductive fabric.

Optionally, the method may further comprise the step of subjecting the base layer to breathable waterproof/waterproof treatment after the calendering step to make up pores of the conductive layer and enhance the insulating properties, wash resistance and flex resistance of the conductive fabric.

The primer layer may be formed by knife rolling, over roll coating, floating knife coating, or knife over roll coating.

The primer layer may be formed of at least one resin selected from the group consisting of polyurethane, acrylic and silicone resins.

The conductive layer may be formed of at least one material selected from the group consisting of a conductive polymer, carbon, a metal material such as silver, and a mixture thereof with a binder.

The conductive polymer may be selected from the group consisting of polyaniline, polypyrrole, polythiophene, and mixtures thereof.

The metal material and the binder may be mixed in a weight ratio of 90:10 to 80:20 to form the conductive layer.

The binder may be selected from the group consisting of polyurethane resins, acrylic resins, silicone resins, melamine resins, epoxy resins, and mixtures thereof.

The binder may be a water-dispersible polyurethane resin.

The conductive layer may have a thickness of 2 μm to 500 μm.

The conductive layer may have a thickness of 10 μm to 20 μm.

The conductive layer may have a width of 10 mm to 20 mm.

The insulating layer may be formed by coating, printing or laminating at least one resin selected from the group consisting of polyurethane, acrylic, silicone, polyester, polyvinyl chloride (PVC) and polytetrafluoroethylene (PTFE) resins on the conductive layer.

The insulating layer may be formed by dry coating, hot-melt dot lamination or gravure lamination.

The conductive layer may have one or more the enlarged portions of bent portions of a circuit whose width is larger than that of linear portions of the circuit.

The enlarged portions may have a circular or oval shape.

The conductive fabric of the present invention may have a resistance difference of 0.5Ω to 4Ω before and after washing.

Advantageous Effects

According to the conductive fabric and the method of the present invention, a pattern can be freely formed on a conductive layer to realize the electrical conductivity of the conductive fabric while ensuring various dynamic wearing performances of the conductive fabric.

Further, according to the conductive fabric and the method of the present invention, a circuit can be designed regardless of bending or folding due to the elasticity and flexibility of a fiber as a material for a base layer to substantially prevent the circuit from damage, such as disconnection.

Further, according to the conductive fabric and method of the present invention, the conductive fabric can be fabricated in a continuous process.

In addition, the conductive fabric and method of the present invention show electrical conductivity (i.e. electricity flow) while retaining inherent functions (e.g., coatability, comfort, breathable waterproofness and tensile strength) of fabric (i.e. clothing).

Advantageously, the conductive fabric of the present invention is washable and has high wash resistance to laundering.

Furthermore, according to the conductive fabric and the method of the present invention, a conductive layer can be maintained uniform due to the presence of a primer layer to allow a constant electric current to flow therethrough.

Moreover, the conductive fabric of the present invention comprises a conductive layer and an insulating layer formed of a material compatible with the conductive layer to achieve high flex resistance.

DESCRIPTION OF DRAWINGS

FIG. 12 is a graph showing variations in the resistance of some conductive fabrics fabricated in Examples before and after washing several times with varying contents of a binder.

FIGS. 13 through 16 are strain-stress curves of divided parts A, B, C and D of a fabric fabricated in Example 7.

Figure 1:
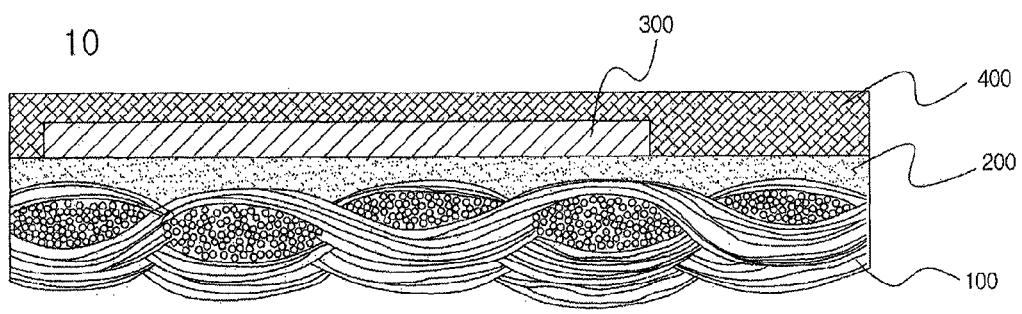
FIG. 1 is a cross-sectional view of a conductive fabric according to a preferred embodiment of the present invention.

<Brief explanation of essential parts of the drawings>

| 10: Conductive fabric, | 100: Base layer, |
|---|---|
| 200: Primer layer, | 300: Conductive layer |
| 400: Insulating layer | |

BEST MODE

Preferred embodiments of the present invention will now be described in detail with reference to the accompanying drawings. It should be noted that whenever possible, the same reference numerals will be used throughout the drawings and the description to refer to the same or like parts. In describing the present invention, detailed descriptions of related known functions or configurations are omitted in order to avoid making the essential subject of the invention unclear.

As used herein, the terms "about", "substantially", etc. are intended to allow some leeway in mathematical exactness to account for tolerances that are acceptable in the trade and to prevent any unconscientious violator from unduly taking advantage of the disclosure in which exact or absolute numerical values are given so as to help understand the invention.

As utilized herein, the term "fabric" is intended to include articles produced by weaving or knitting, non-woven fabrics, fiber webs, and so forth.

FIG. 1 is a cross-sectional view of a conductive fabric 10 according to a preferred embodiment of the present invention.

The conductive fabric 10 comprises a base layer 100, a primer layer 200, a conductive layer 300, and an insulating layer 400. Optionally, the primer layer 200 may be omitted.

Any type of woven or knitted fabric, non-woven fabric, fiber web or so forth may be used to form the base layer 100. There is no particular limitation on the material and formation method of the base layer. For example, the base layer 100 may be composed of a synthetic fiber (e.g., polyester, polyamide or polyurethane), a cellulose regenerated fiber (e.g., rayon or acetate) or a natural fiber (e.g., cotton or wool).

The base layer 100 has a very non-uniform microscopic surface and extremely many fine pores due to gaps between fiber filaments. The primer layer 200 formed on the base layer 100 makes the surface of the base layer 100 uniform and allows the conductive layer to be formed to a uniform thickness. The primer layer 200 prevents a constituent material of the conductive layer from penetrating the base layer 100. The primer layer 200 may be optionally formed on the base layer 100. Thus, it is to be understood that the primer layer 200 can be excluded according to the characteristics of the conductive fabric.

The primer layer 200 may be formed of at least one resin selected from the group consisting of polyurethane, acrylic and silicone resins.

The primer layer may be formed in a monolayer or bilayer structure with a water-repellent layer (not shown). The water-repellent layer can be formed by a common water-repellent processing method. Non-limiting examples of suitable materials for the water-repellent layer include fluorine and silicone. The water-repellent layer may be formed on or under the fabric of the conductive layer to prevent the resin constituting the conductive layer from permeating into the base layer 100.

Electricity can flow through the conductive layer 300 formed on the primer layer 200. The shape of the conductive layer 300 can be pre-designed and details thereof will be described later. The conductive layer 300 may be formed of at least one material selected from the group consisting of a conductive polymer, carbon, a metal material such as silver, and a mixture thereof with a binder. For example, the conductive layer 300 is formed of a dispersion of an electrically conductive filler in a vehicle, which is printed to form an electrically conductive cured film. Typical applications of the conductive layer 300 are LCD electrode printing, touch screen printing, conductive pattern printing for circuit boards, contact and pattern printing of thin-film switch plates and electromagnetic shielding. Non-limiting examples of suitable conductive fillers for use in the present invention include conductive metals, such as silver, platinum, palladium, copper and nickel. Preferred is silver. The conductive polymer may be selected from the group consisting of polyaniline, polypyrrole, polythiophene, and mixtures thereof.

The conductive layer 300 preferably has a thickness of 2 µm to 500 µm. When the thickness of the conductive layer is below the range, it is difficult to ensure the thickness uniformity of the conductive layer. Meanwhile, when the thickness of the conductive layer is above the range, an increase in resistance is caused, leading to an increase in power consumption. More preferably, the conductive layer has a thickness of 10 μm to 20 μm. The conductive layer preferably has a width of 10 mm to 20 mm. Although an increase in the width of the conductive layer leads to a reduction in resistance and a stable flow of electricity, an excessive increase in the width of the conductive layer causes the problems of increased production costs and poor coatability. It is preferred that the conductive fabric of the present invention has a resistance difference before and after washing of 0.5Ω to 4Ω. It is actually difficult to attain the resistance difference below this range, and the resistance difference above this range impedes the stable flow of electricity.

The binder may be selected from the group consisting of polyurethane resins, acrylic resins, silicone resins, melamine resins, epoxy resins, and mixtures thereof. Preferably, the binder is a water-dispersible polyurethane resin.

The insulating layer 400 may be formed by coating, printing or laminating at least one resin selected from the group consisting of polyurethane, acrylic, silicone, polyester, polyvinyl chloride (PVC) and polytetrafluoroethylene (PTFE) resins on the conductive layer 300. The insulating layer 400 functions to protect the conductive layer from damage, such as cracks, impart flexibility to the fabric, and render the fabric breathable waterproof or waterproof.

Figure 2:
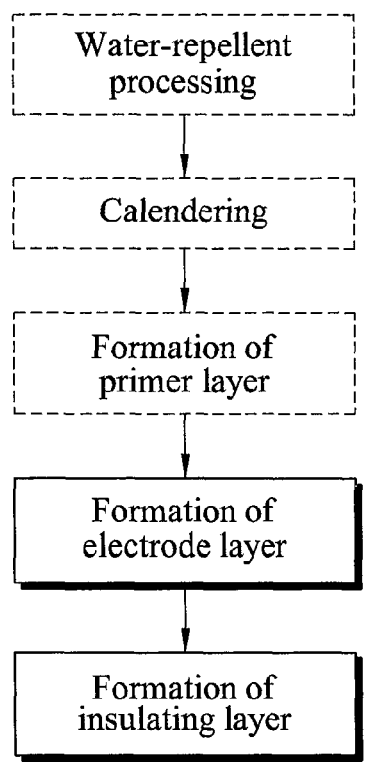
FIGS. 2 and 3 are process charts illustrating methods for fabricating conductive fabrics according to embodiments of the present invention.
Figure 3:
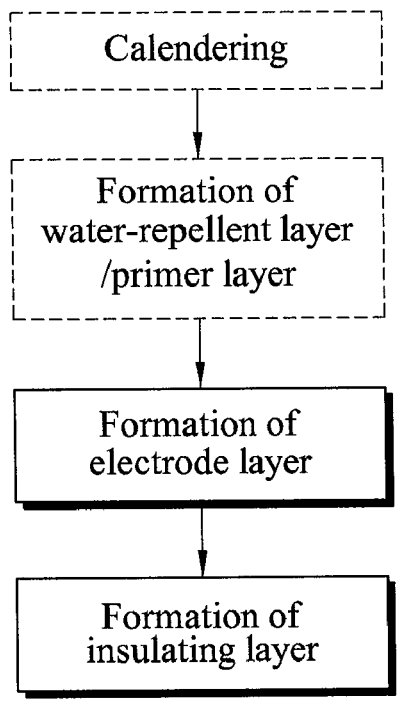

Explanation of methods for fabricating conductive fabrics according to preferred embodiments of the present invention will be provided below with reference to FIGS. 2 and 3. FIGS. 2 and 3 are process charts illustrating the methods.

A woven or knitted textile as a material for a base layer 100 is introduced between two pressing rollers to compensate surface irregularities of the textile (calendering). This calendering is performed to make the surface of the base layer 100 smooth, make up pores of the base layer 100 and enhance the flex resistance of the conductive fabric. The calendering step is optional depending on the characteristics of the fabric of the base layer 100.

A primer layer 200 is formed on the base layer, which has optionally undergone calendering, to achieve more active control of the surface pores of the base layer and uniform thickness of a conductive layer 300 to be formed thereon. The primer layer 200 may be formed by knife rolling, over roll coating, floating knife coating, knife over roll coating, laminating, printing or gravure coating. The formation of the primer layer is optional.

The primer layer may be formed in a multilayer structure with a water-repellent layer. The water-repellent layer can be formed before or after the calendering step. The process charts of FIGS. 2 and 3 illustrate the formation of the water-repellent layer before the calendering step and the formation of the water-repellent layer and/or the primer layer after the calendering step, respectively, but the method of the present invention is not limited thereto.

A conductive layer 300 is formed on the primer layer 200 or the base layer. The conductive layer 300 is previously designed. The conductive layer 300 can be formed by various techniques, such as coating, printing and transfer printing. In a particular embodiment of the present invention, the conductive layer 300 is formed by printing. In this case, a circuit can be designed in the conductive fabric according to the pre-designed pattern, regardless of the placement of an electronic device. In view of the foregoing, the conductive fabric of the present invention can be termed a 'flexible printed fabric circuit board (FPFCB)'.

It is preferred to maintain the thickness and width of the conductive layer 300 as 2-500 μm and 10-20 mm, respectively. It is preferred to maintain the resistance difference of the conductive fabric as 0.5-4Ω before and after washing. The conductive layer may be composed of 1-30% by weight of carbon and 1-70% by weight of silver. A binder that can be used to form the conductive layer is selected from the group consisting of polyurethane resins, acrylic resins, silicone resins, melamine resins, epoxy resins, and mixtures thereof, which are compatible with the primer layer 200.

Figure 4:
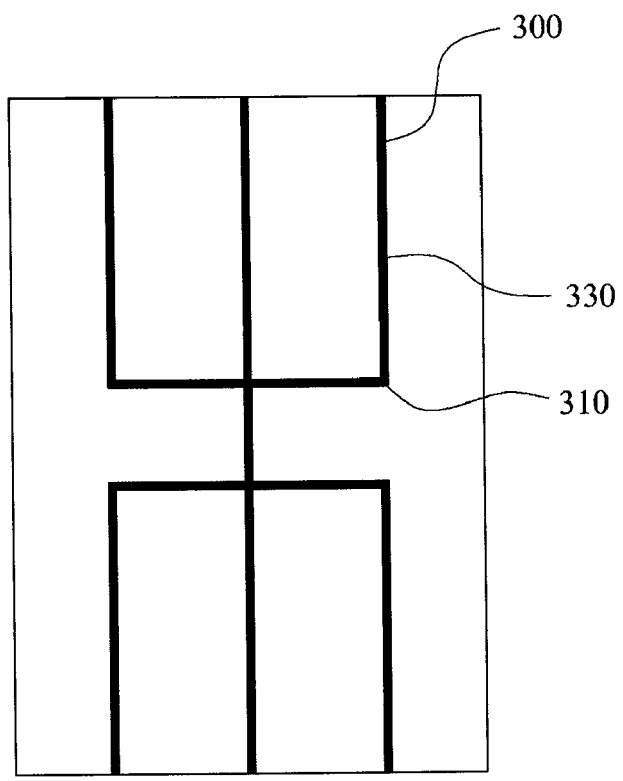
FIGS. 4 and 5 are explanatory views of a conductive layer pattern having uniform bent portions and a conductive layer pattern having wide bent portions of conductive fabrics according to embodiments of the present invention.
Figure 5:
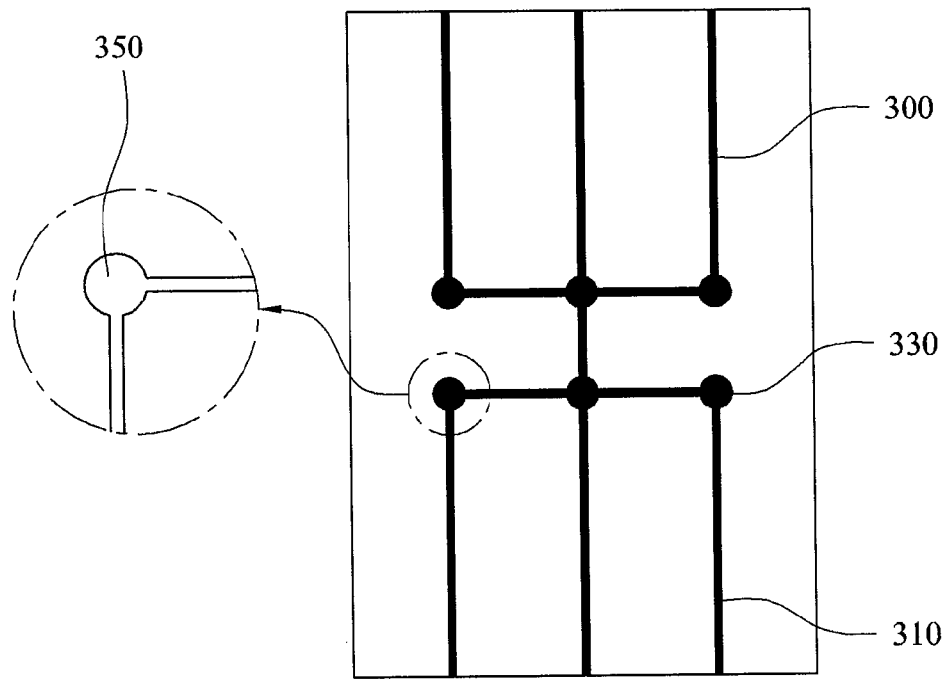

FIGS. 4 and 5 exemplarily illustrate conductive layers of the conductive fabric according to embodiments of the present invention. Specifically, FIG. 4 illustrates a circuit pattern having uniform bent portions 330 and FIG. 5 illustrates a circuit pattern having the enlarged portion 350 of bent portions 330 whose width is larger than that of linear portions 310 of the circuit pattern. The enlarged portions 350 may have any shape. For example, the enlarged portions 350 have a circular or oval shape.

The reason why the bent portions are wider than the linear portions can be supported by the following equations:

$$W = I^2 R$$

$$R = \rho \cdot L / S$$

(W: power, R: resistance, ρ: specific resistance, L: length of conducting line, and S: cross-sectional area).

As the cross-sectional area increases, the resistance decreases and the flow of electricity increases. Accordingly, a larger amount of current flows in the wider enlarged portions 350 than in the linear portions 310.

A sudden change (i.e. surge) in electric current is caused in the bent portions 330 at predetermined angles, such as right angles, to generate heat.

A surge refers to a transient waveform of electric current, voltage or power that abruptly increases within a short time and gradually decreases during flow along an electric wire or circuit. A surge is mainly responsible for electricity interruption, telephone disconnection and damage to sensitive semiconductors when lightning flashes. Since sudden over-voltage, particularly strong or long surge in a power line may cause dielectric breakdown or disorder of electronic devices, a surge protector or inhibitor is installed between a power supply terminal and a computer terminal to inhibit or minimize a change in electric current.

Thus, the resistance is reduced by varying the area of the bent portions 330 to minimize the occurrence of surge and allow the electricity to smoothly flow through the conductive layer despite an increase in the amount of current.

An insulating layer 400 can be formed on the conductive layer 300. The insulating layer 400 may be formed by direct coating, printing or laminating a solvent-type polyurethane resin, a water-dispersible polyurethane resin, an oil-soluble acrylic resin, a water-soluble acrylic resin, a silicone resin, a polyester resin or a polytetrafluoroethylene (PTFE) resin on the conductive layer 300. Dry coating, hot-melt dot lamination or gravure lamination is preferably employed to form the insulating layer.

The coating composition for the insulating layer causes a variation in resistance, thereby affecting the durability of the insulating layer.

The insulating layer can be formed on one or both surfaces of the conductive fabric. Taking into consideration the fact that the conductive fabric undergoes washing several times, the choice of a suitable coating composition for long-term insulation, i.e. excellent wash fastness, is an important factor.

After the calendering step, the base layer 100 can be selectively subjected to breathable waterproof treatment or waterproof treatment. Pores formed after the breathable waterproof treatment or waterproof treatment serve to make up the pores of the base layer and to achieve enhanced insulating properties, wash resistance and flex resistance of the conductive fabric. A material used for the breathable waterproof treatment is preferably a resin compatible with the conductive material (breathable waterproof/waterproof treatment step).

Consequently, according to the method of the present invention, the need to previously form a region through which electricity flows in designing the conductive fabric is avoided, a conductive region can be directly formed in already-fabricated fabric or clothing, and no restriction is imposed on the wearability of the conductive fabric despite the presence of the conductive region to ensure dynamic wearability of the conductive fabric.

MODE FOR INVENTION

Examples

Example 1

A polyester plain weave fabric as a base layer was subjected to calendering and fluorine-based water-repellent processing, and a solvent-type polyurethane resin was used to form a primer layer thereon. A silver paste was applied to the primer layer by screen printing to form a conductive layer having a width of 10 mm and a thickness of 10 µm, and then a liquid silicone rubber was used to form an insulating layer thereon, thus completing the fabrication of a conductive fabric.

Example 2

A conductive fabric was fabricated in the same manner as in Example 1, except that the base layer was subjected to fluorine-based water-repellent processing only.

Example 3

A conductive fabric was fabricated in the same manner as in Example 1, except that silicone-based water-repellent processing was performed and a mixture of silicone and acrylic resins was used to form a primer layer.

Example 4

A conductive fabric was fabricated in the same manner as in Example 1, except that the base layer was subjected to silicone-based water-repellent processing only.

Example 5

A conductive fabric was fabricated in the same manner as in Example 1, except that a mixture of a silver paste and an acrylic binder in a weight ratio of 90:10 was used to form a conductive layer.

Example 6

A conductive fabric was fabricated in the same manner as in Example 2, except that a mixture of a silver paste and an acrylic binder in a weight ratio of 90:10 was used to form a conductive layer.

Example 7

A conductive fabric was fabricated in the same manner as in Example 1, except that a mixture of a silver paste and a water-dispersible polyurethane binder in a weight ratio of 90:10 was used to form a conductive layer.

Example 8

A conductive fabric was fabricated in the same manner as in Example 2, except that a mixture of a silver paste and a water-dispersible polyurethane binder in a weight ratio of 90:10 was used to form a conductive layer.

Example 9

A conductive fabric was fabricated in the same manner as in Example 1, except that a mixture of a silver paste and a silicone binder in a weight ratio of 90:10 was used to form a conductive layer.

Example 10

A conductive fabric was fabricated in the same manner as in Example 2, except that a mixture of a silver paste and a silicone binder in a weight ratio of 90:10 was used to form a conductive layer.

Example 11

A conductive fabric was fabricated in the same manner as in Example 7, except that the silver paste and the binder were used in a weight ratio of 95:5 to form a conductive layer.

Example 12

A conductive fabric was fabricated in the same manner as in Example 7, except that the silver paste and the binder were used in a weight ratio of 85:15 to form a conductive layer.

Example 13

A conductive fabric was fabricated in the same manner as in Example 7, except that the silver paste and the binder were used in a weight ratio of 80:20 to form a conductive layer.

Example 14

A conductive fabric was fabricated in the same manner as in Example 8, except that the silver paste and the binder were used in a weight ratio of 95:5 to form a conductive layer.

Example 15

A conductive fabric was fabricated in the same manner as in Example 8, except that the silver paste and the binder were used in a weight ratio of 85:15 to form a conductive layer.

Example 16

A conductive fabric was fabricated in the same manner as in Example 8, except that the silver paste and the binder were used in a weight ratio of 80:20 to form a conductive layer.

Example 17

A conductive fabric was fabricated in the same manner as in Example 7, except that the conductive layer was formed by screen printing to have a width of 20 mm.

Example 18

A conductive fabric was fabricated in the same manner as in Example 7, except that the conductive layer was formed by screen printing to have a thickness of 10 μm.

Comparative Example 1

A conductive fabric was fabricated in the same manner as in Example 7, except that the conductive layer was not formed.

Test Results

1. Wash Resistance

*Test method (KS K ISO 6330)

The variations in the resistance of the conductive fabrics fabricated in the respective examples and the comparative example were measured after washing to examine conditions under which the wash resistance of the conductive fabrics was ensured. Specifically, the conductive fabrics were washed without any detergent in a wool course (57 min.) of a horizontal drum type washer (WD-CR 1010, LG Electronics, Inc.), and dried at a high temperature for one hour to measure the resistance and variations in the resistance of the conductive fabrics.

TABLE 1

| Washing frequency | Resistance (Ω) | | | | | |
|---|---|---|---|---|---|---|
| | 0 | 1 | 2 | 3 | 4 | 5 |
| Example 1 | 0.83 | 1.23 | 2.27 | 3.21 | 7.80 | 13.40 |
| Example 2 | 0.69 | 1.70 | 3.27 | 4.50 | 7.50 | 10.20 |
| Example 3 | 0.84 | 240.00 | 590.00 | 710.37 | 900.80 | 10000.00 |
| Example 4 | 0.94 | 56.00 | 89.65 | 100.89 | 788.90 | 1002.22 |
| Example 5 | 1.49 | 3.20 | 9.73 | 62.30 | 260.70 | 777.23 |
| Example 6 | 1.80 | 5.20 | 16.80 | 59.20 | 300.00 | 1900.00 |
| Example 7 | 1.7 | 2.6 | 3.1 | 3.52 | 4.6 | 5.50 |
| Example 8 | 1.26 | 1.37 | 3.1 | 3.42 | 4.13 | 4.57 |
| Example 9 | 1.44 | 34.10 | 1888.00 | 2777.00 | 3102.00 | 5800.00 |
| Example 10 | 2.19 | 54.60 | 2800.00 | 5780.00 | 7880.00 | 9570.00 |

*Evaluation

Figure 6:
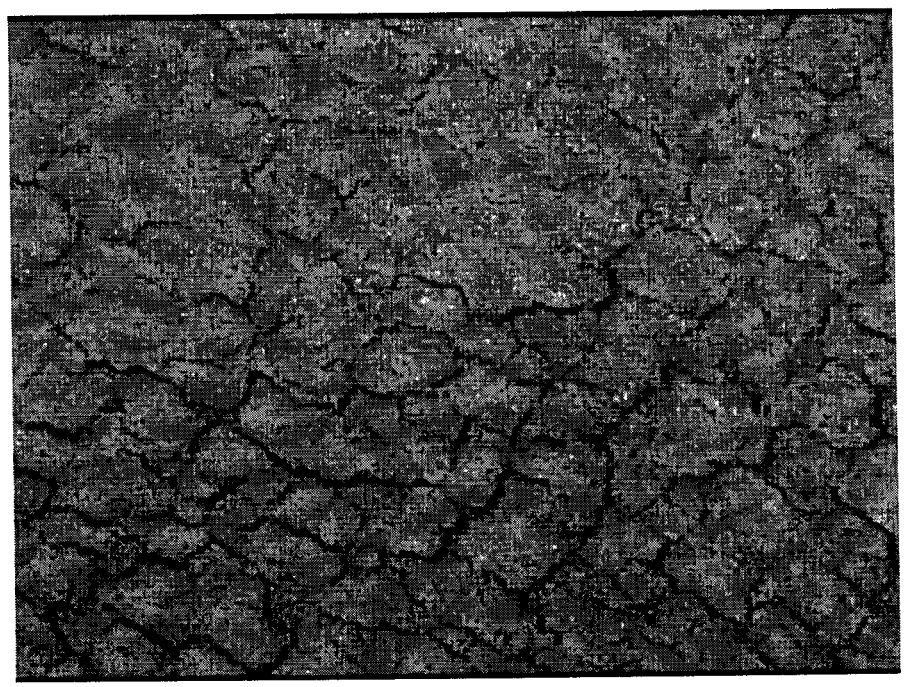
FIGS. 6 through 9 are photographs showing surfaces of a conductive layer of a conductive fabric fabricated in Example 1 after washing once, a conductive layer of a conductive fabric fabricated in Example 2 after washing once, a conductive layer of a conductive fabric fabricated in Example 7 after washing four times and a conductive layer of a conductive fabric fabricated in Example 8 after washing four times.
Figure 7:
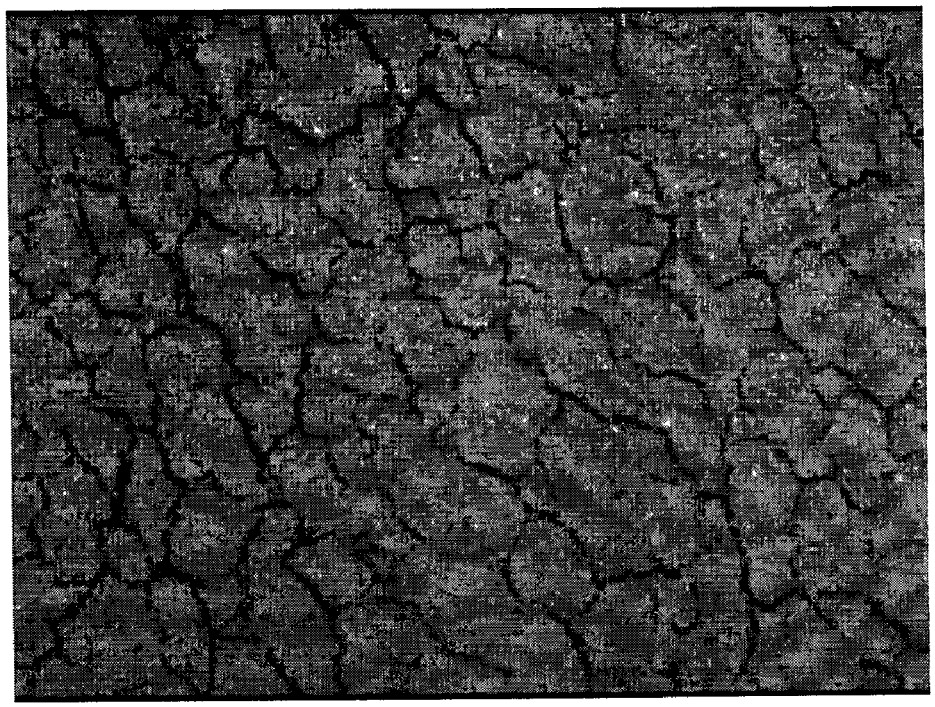
Figure 8:
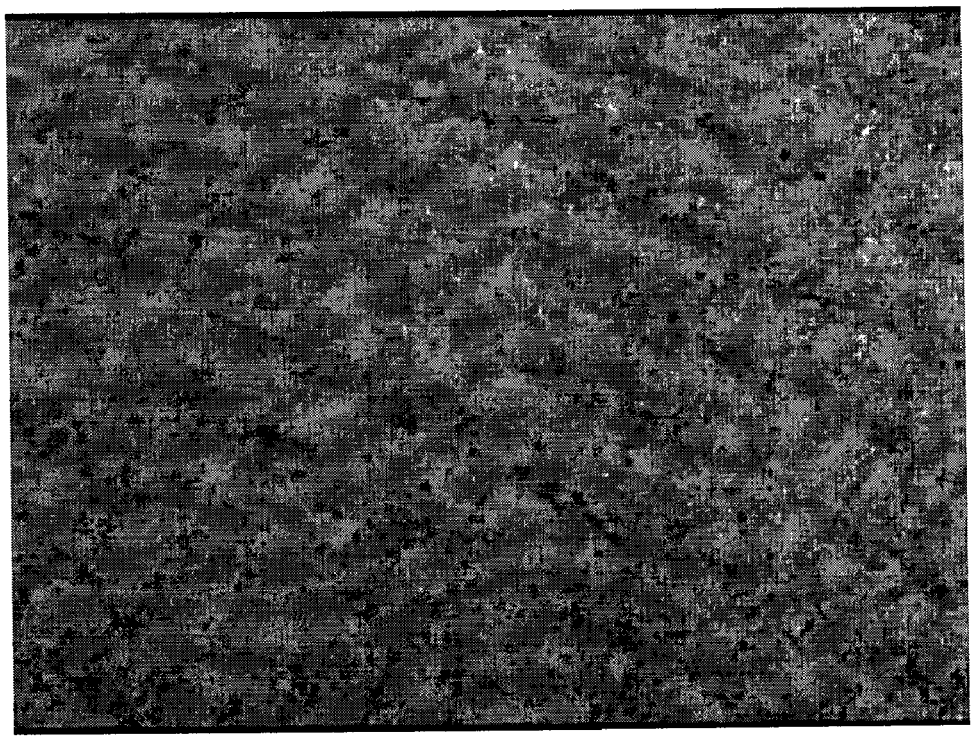
Figure 9:
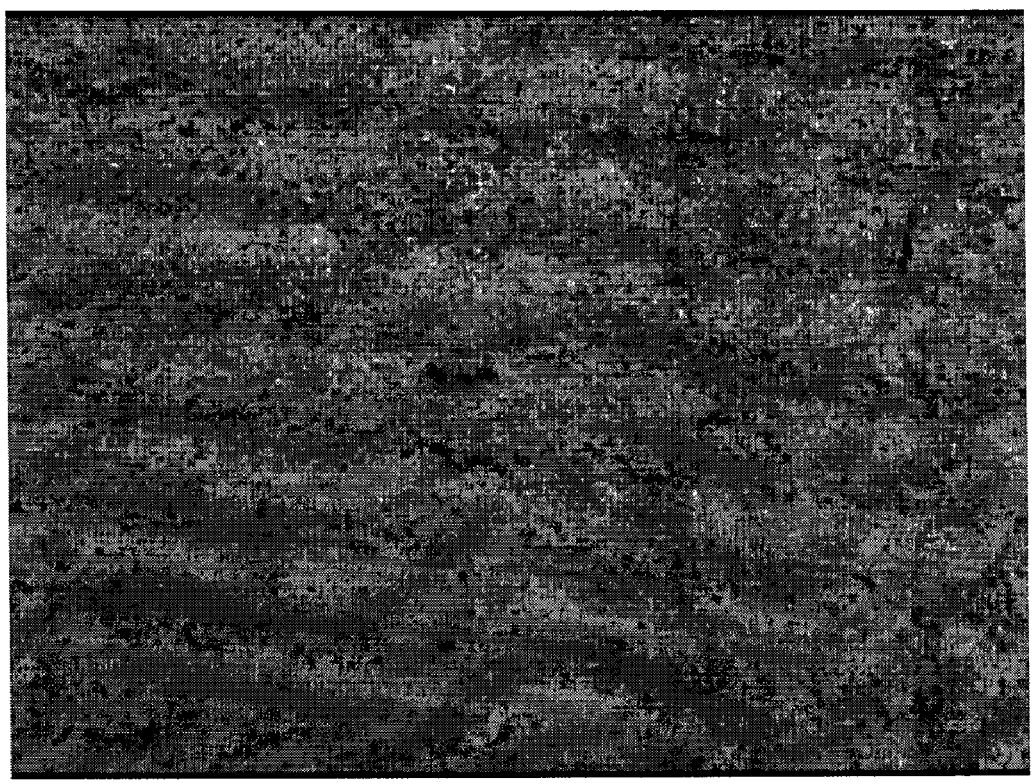
Figure 10:
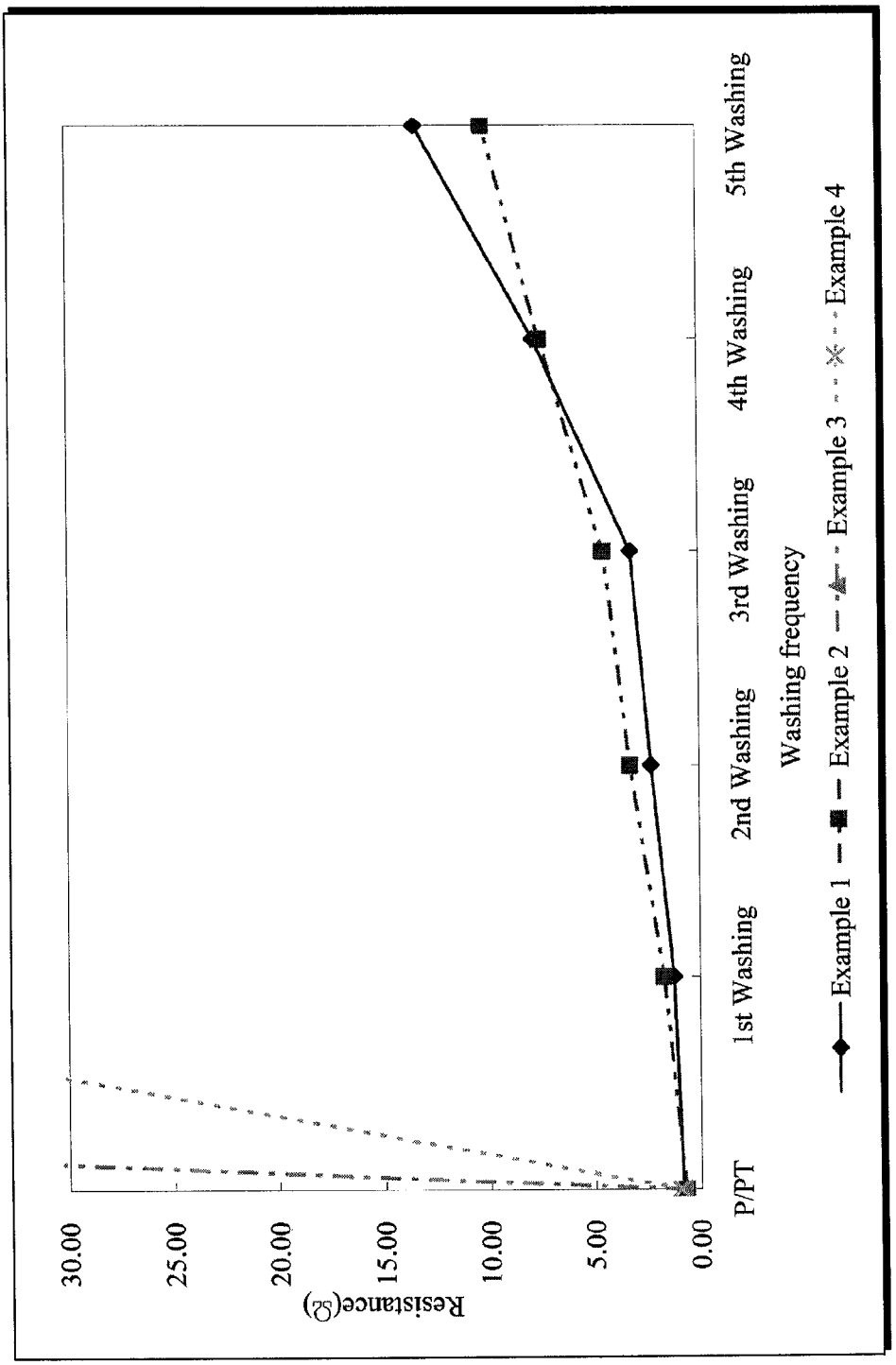
FIG. 10 is a graph showing variations in the resistance of conductive fabrics fabricated in Examples 1 to 4 before and after washing several times.
Figure 11:
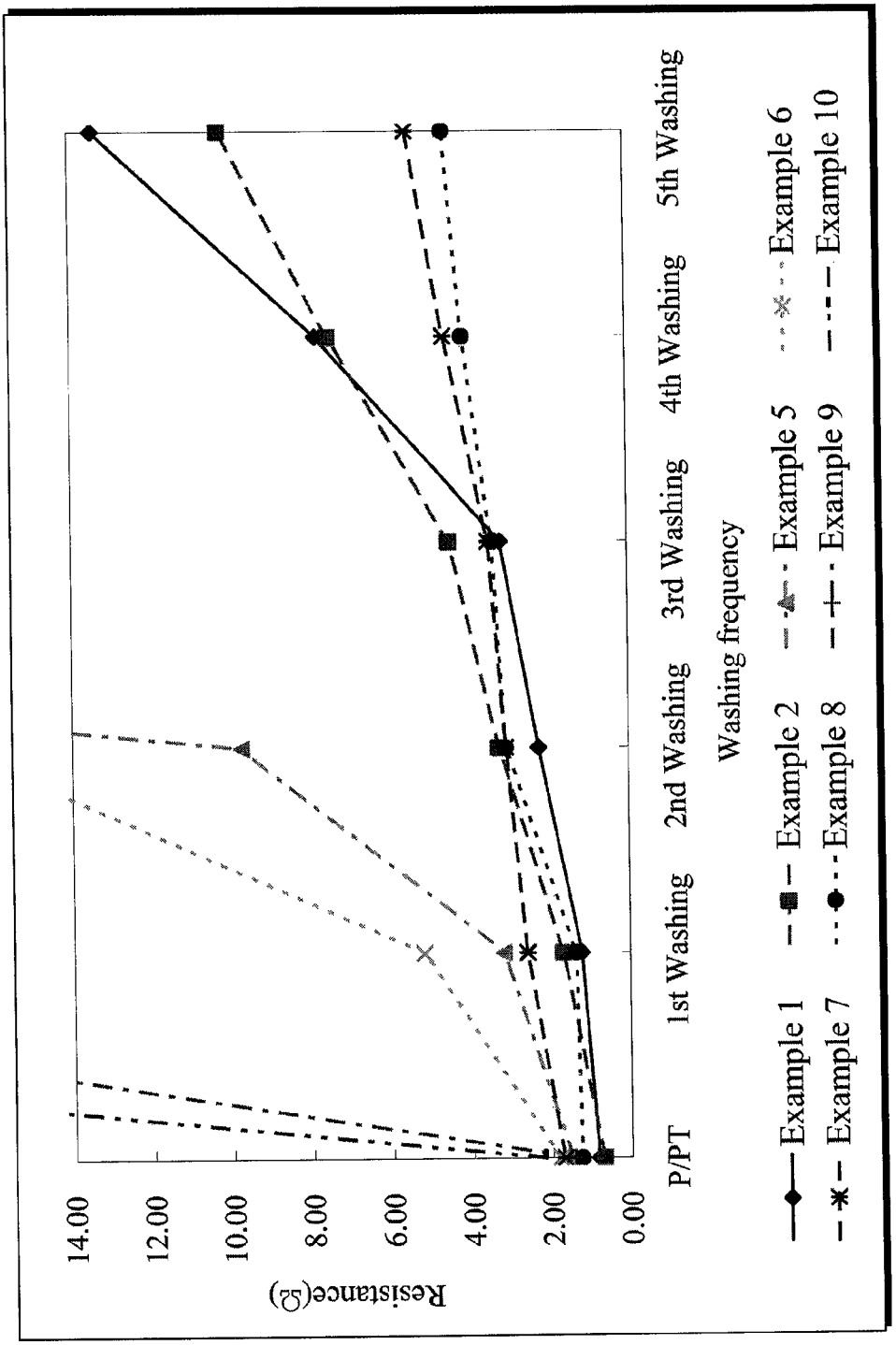
FIG. 11 is a graph showing variations in the resistance of some conductive fabrics fabricated in Examples before and after washing several times.
Figure 1:
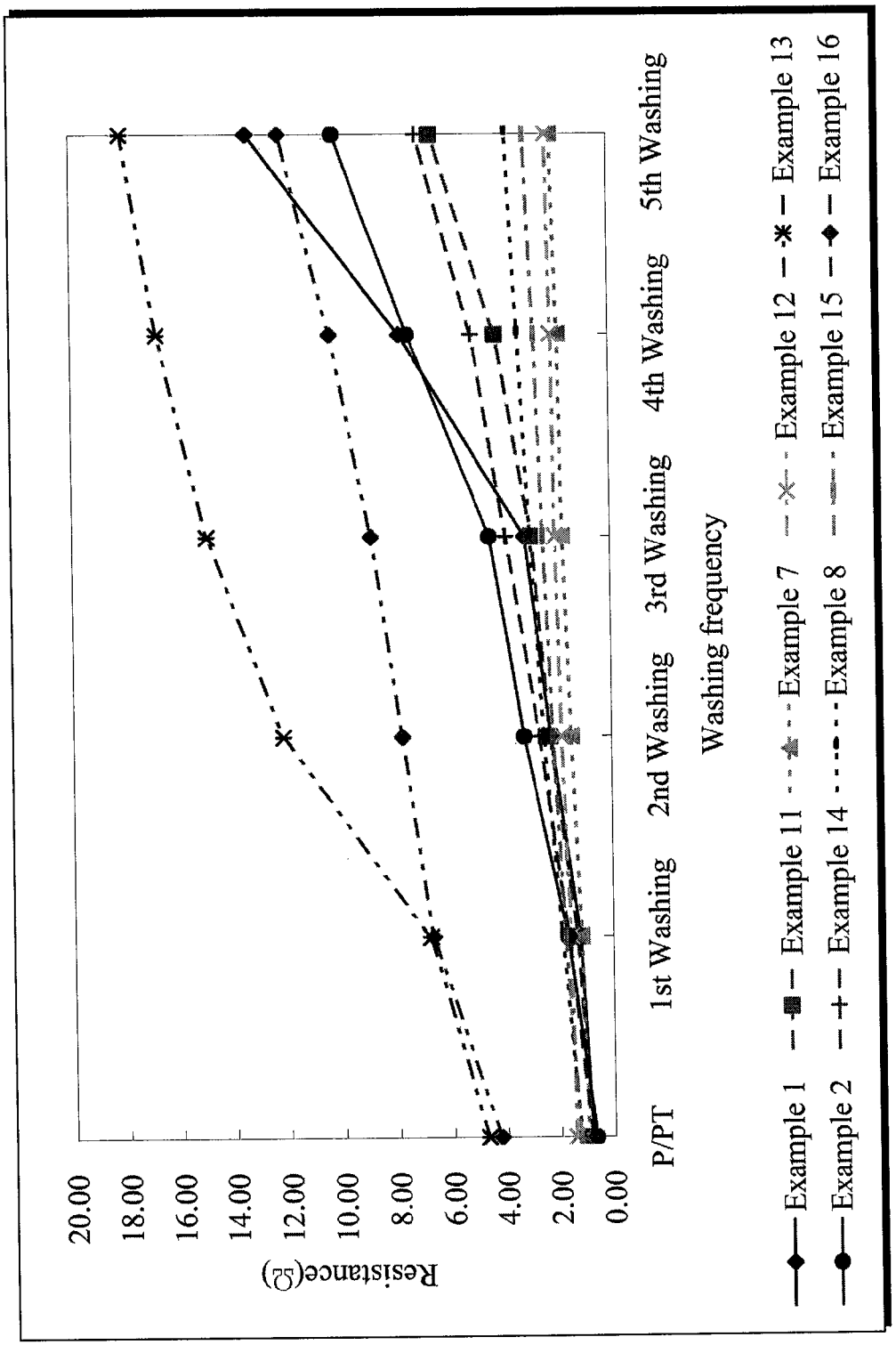
Figure 13:
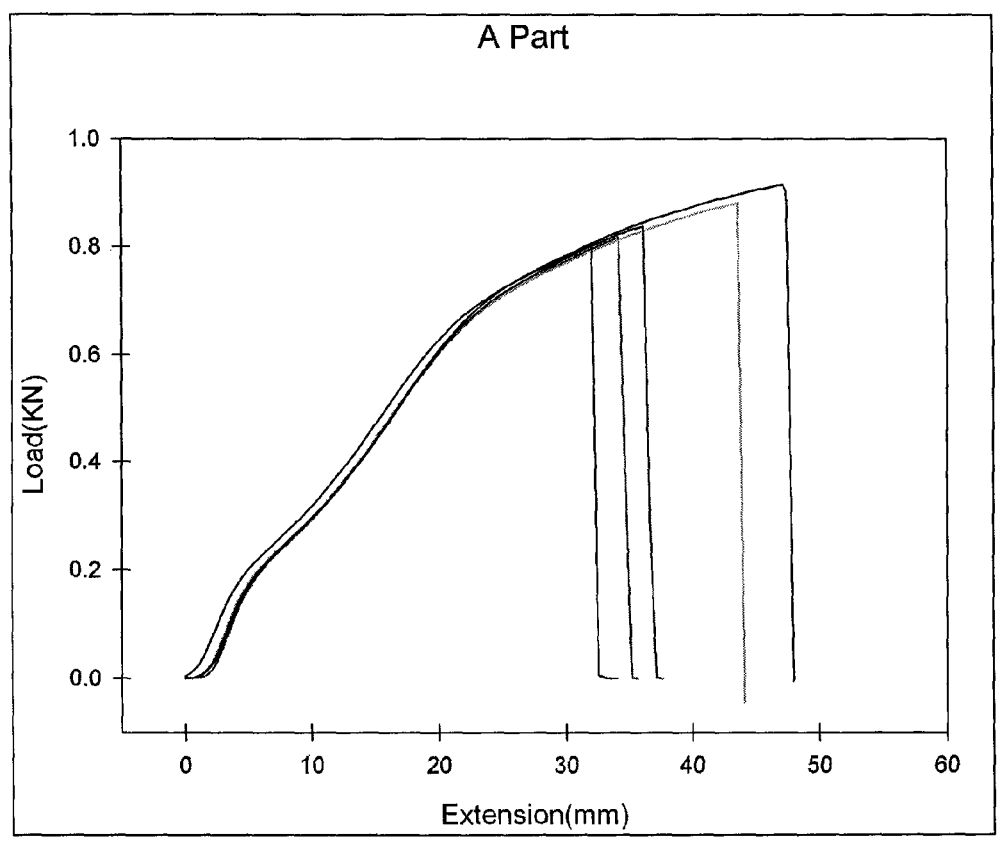
Figure 14:
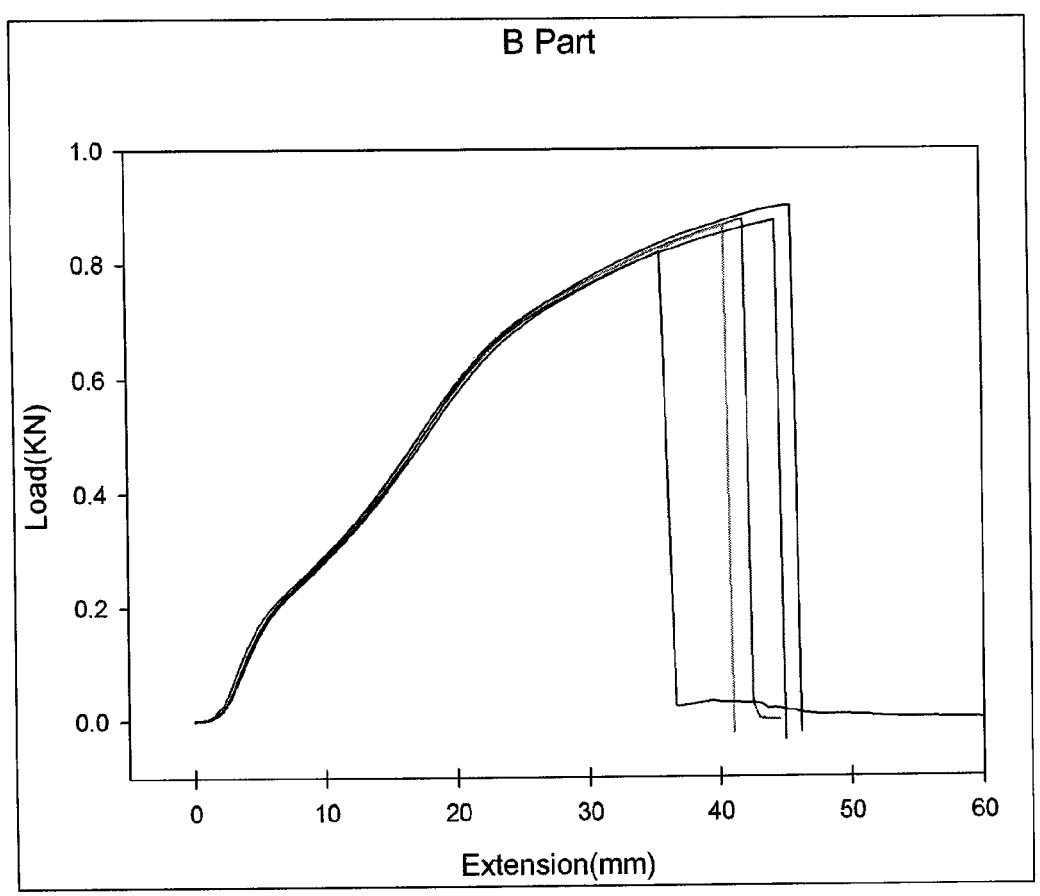
Figure 15:
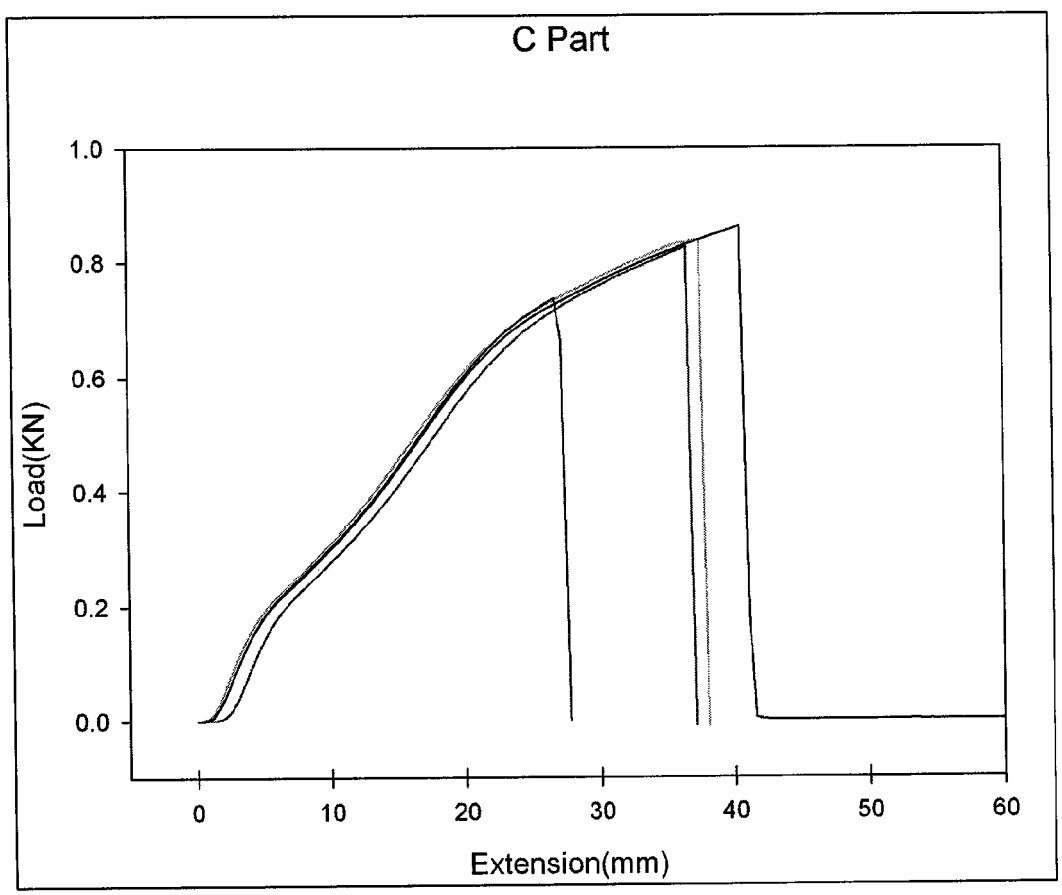
Figure 1:
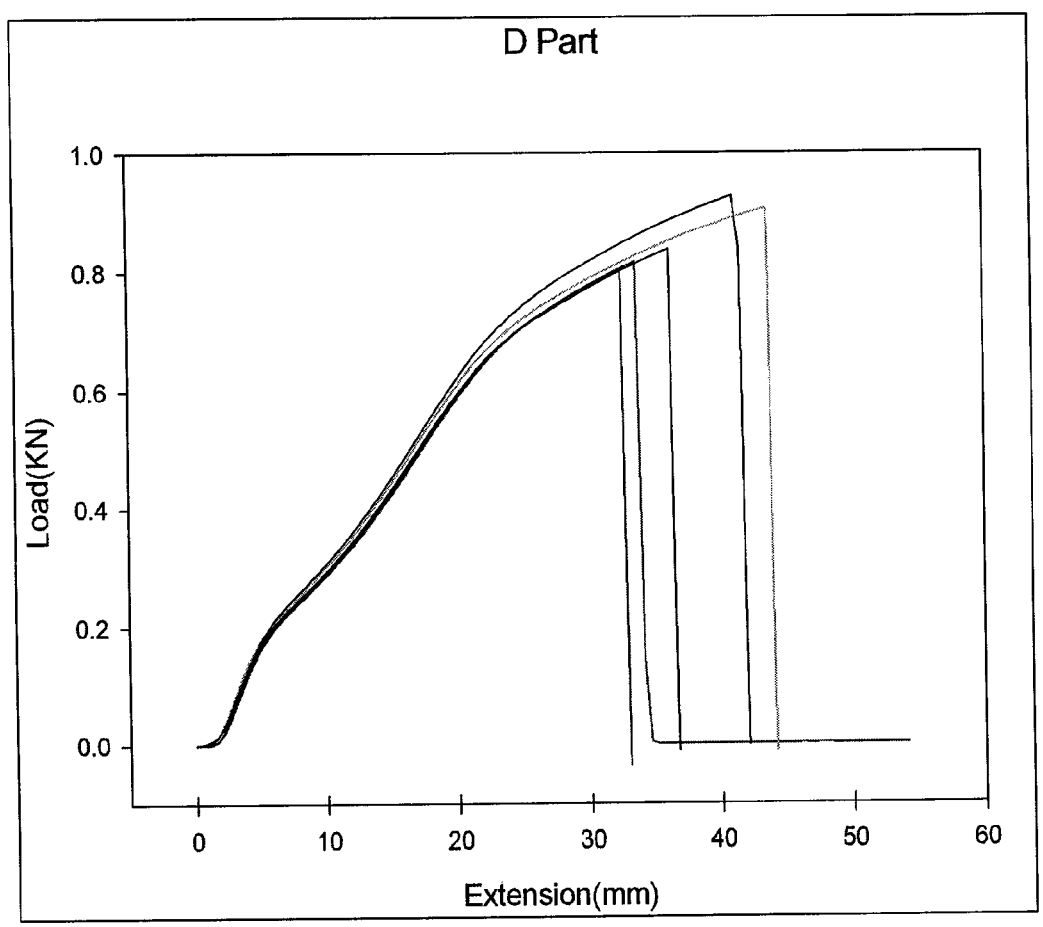
Figure 17:
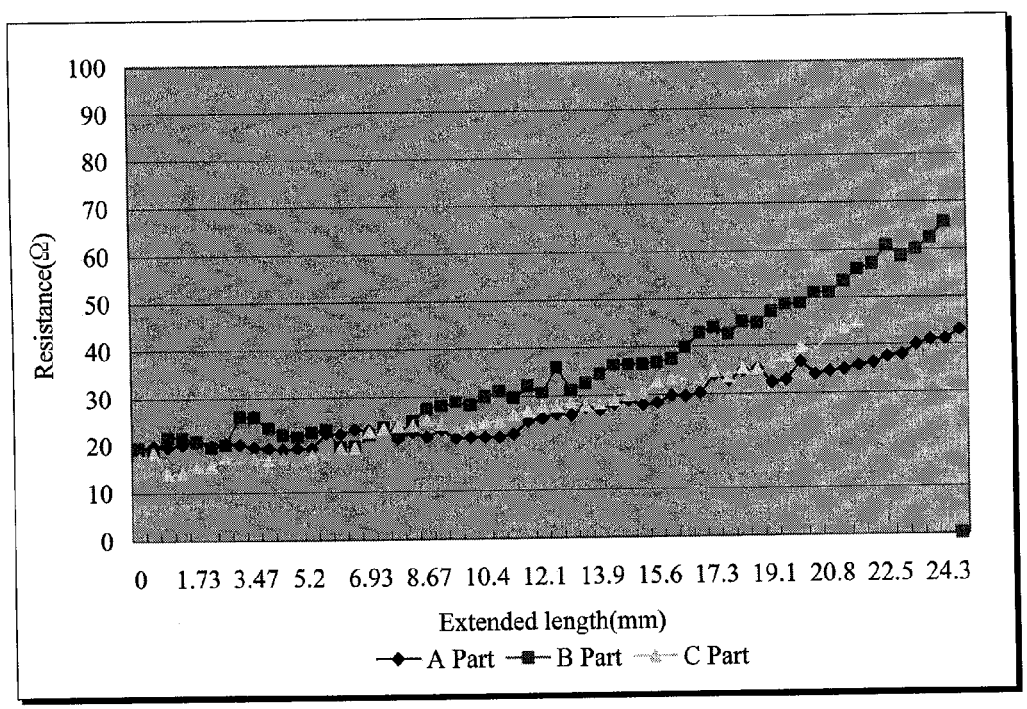
FIG. 17 is a graph showing variations in the resistance of divided parts A, B and C of a fabric fabricated in Example 7 upon tensile deformation.

As can be seen from Table 1, increments in the resistance of the samples of Examples 7 and 8 were relatively low, whereas those in the resistance of the samples of Examples 1 and 2 were relatively high because cracks were formed on the surfaces of the conductive layers to impede the flow of electricity even after washing just once (FIGS. 6 and 7). No damage was found on the surfaces of the conductive layers of the samples of Examples 7 and 8 even after washing four times (FIGS. 8 and 9). This is believed that the binder contributed to the improvement in the adhesion between the base layer and the silver paste, and particularly, the water-dispersible polyurethane binder relieved the friction and physical deformation caused by the washing due to the inherent characteristics (elasticity) of the polyurethane mixed with the silver paste to reduce the occurrence of cracks, thus decreasing the increments of resistance.

2. Evaluation of the Dependence on Binder Content

*Test method (KS K ISO 6330)

The resistance and the variations in the resistance of the conductive fabrics with varying binder contents (0-20 wt %) were measured after washing. The results are shown in Table 2.

TABLE 2

| Example No. | Binder Content (wt %) | Washing Frequency (0) | Resistance (Ω) | | | | |
|---|---|---|---|---|---|---|---|
| | | | 1 | 2 | 3 | 4 | 5 |
| 1 | 0 | 0.83 | 1.23 | 2.27 | 3.21 | 7.80 | 13.40 |
| 11 | 5 | 0.88 | 1.33 | 2.30 | 2.95 | 4.23 | 6.60 |
| 7 | 10 | 0.99 | 1.2 | 1.51 | 1.78 | 1.9 | 2.13 |
| 12 | 15 | 1.45 | 1.58 | 1.87 | 2.06 | 2.14 | 2.3 |
| 13 | 20 | 4.7 | 6.8 | 12.2 | 15 | 16.80 | 18.10 |
| 2 | 0 | 0.69 | 1.70 | 3.27 | 4.50 | 7.50 | 10.20 |
| 14 | 5 | 0.86 | 1.66 | 2.70 | 3.90 | 5.13 | 7.14 |
| 8 | 10 | 1.26 | 1.9 | 2.53 | 3 | 3.4 | 3.8 |
| 15 | 15 | 1.28 | 1.79 | 2.19 | 2.5 | 2.8 | 3.13 |
| 16 | 20 | 4.23 | 6.7 | 7.8 | 8.9 | 10.37 | 12.22 |

Table 2 shows that the increments in resistance were remarkably reduced due to the addition of the water-dispersible polyurethane binder, but the initial resistance values were increased in proportion to the content of the binder. The wash resistance was poor when the binder content was 5 wt %, and the initial resistance values were increased when the binder content was 20 wt % despite improved wash resistance. Satisfactory conductivity is believed to be achieved when the resistance difference of the conductive layers before and after the washing was within the range of 0.5Ω to 4Ω.

3. Measurement of Exothermic Temperatures in Conductive Layers

When a resistance is raised beyond a predetermined level, the flow of electricity is impeded due to an overload when a voltage is applied. Hence, heat may be generated in the conductive layers (particularly, power supply connectors and patterns) of the conductive fabrics fabricated in the respective examples. The generation of heat in the conductive layers was examined using a thermal imaging camera (InfraCAM, FLIR system) by varying the thickness and width of the electrodes and the content of the binder.

(1) Heat Generation Patterns According to Binder Contents

Table 3 shows profiles of heat generation patterns of the conductive fabrics of Example 1 (binder content: 0 wt %), Example 11 (5 wt %), Example 7 (10 wt %), Example 12 (15 wt %) and Example 13 (20 wt %). Table 3 shows that the exothermic temperatures of the conductive layers increased with increasing binder contents. This increase in the exothermic temperatures of the conductive fabrics is attributed that the mixing of the constituent inorganic component of the conductive layers with the non-conductive organic material caused a deterioration the electrical conductivity of the conductive layers. Judging from the results of Test 1 that the conductive fabrics containing the binder showed improved wash resistance in Test 1, it is necessary to determine optimal conditions between the wash resistance and the electrical conductivity of the conductive fabrics. In view of the foregoing, it can be concluded that the most preferred content of the binder is in the range of 10 to 15 wt %.

TABLE 3

| Exothermic temperatures in conductive layers at different binder contents | | | | |
|---|---|---|---|---|
| 0 wt % | 5 wt % | 10 wt % | 15 wt % | 20 wt % |
| Max. 38.9° C. | Max. 41.3° C. | Max. 42.0° C. | Max. 49.4° C. | Max. 55.7° C. |
| Min. 29.8° C. | Min. 32.4° C. | Min. 35.7° C. | Min. 38.3° C. | Min. 42.3° C. |
| Avg. 34.6° C. | Avg. 36.8° C. | Avg. 39.0° C. | Avg. 40.3° C. | Avg. 51.2° C. |

(2) Effects of Line Width of Conductive Layers

Table 4 shows profiles of heat generation patterns of the conductive fabrics of Example 7 (line width: 1 cm) and Example 17 (2 cm). An exothermic band was observed at 50° C. in the conductive fabric of Example 7, which is believed to be because electric charges did not flow readily through the conductive layer. In contrast, a decrease in exothermic temperature was observed in the conductive fabric of Example 17.

TABLE 4

Exothermic temperatures in conductive layers at different line widths 1 cm

| Max. 42.0° C. | Max. 42.6° C. | Max. 43.9° C. |
|---|---|---|
| Min. 35.7° C. | Min. 34.9° C. | Min. 35.5° C. |
| Avg. 39.0° C. | Avg. 38.9° C. | Avg. 38.8° C. |

2 cm

| Max. 38.0° C. | Max. 38.1° C. | Max. 33.3° C. |
|---|---|---|
| Min. 34.8° C. | Min. 35.2° C. | Min. 35.7° C. |
| Avg. 36.6° C. | Avg. 36.5° C. | Avg. 34.7° C. |

(3) Effects of Thickness of Conductive Layers

Table 5 shows profiles of heat generation patterns of the conductive fabrics of Example 7 (thickness: 10 µm) and Example 18 (20 µm). Exothermic bands were observed at 45° C. and 29° C. in the conductive fabrics of Examples 7 and 18, respectively, indicating that the electrical conductivity of the conductive fabrics was affected by the thickness of the conductive layers.

TABLE 5

Exothermic temperatures in conductive layers at different thicknesses

10 µm

| Max. 42.0° C. | Max. 42.6° C. | Max. 43.9° C. |
|---|---|---|
| Min. 35.7° C. | Min. 34.9° C. | Min. 35.5° C. |
| Avg. 39.0° C. | Avg. 38.9° C. | Avg. 38.8° C. |

20 µm

| Max. 39.2° C. | Max. 39.9° C. | Max. 38.3° C. |
|---|---|---|
| Min. 33.0° C. | Min. 34.8° C. | Min. 34.7° C. |
| Avg. 36.6° C. | Avg. 37.6° C. | Avg. 36.7° C. |

4. Estimation of Tensile Strength

Tension tests were conducted on the conductive fabrics of Example 17 and Comparative Example 1 in accordance with the ASTM D 5034-94 standard method. Specifically, each of the conductive fabrics was cut to a size of 50±1 mm (width)× 150 mm (length). The sample was divided into four parts A, B, C and D. The divided parts were measured for tensile strength. The measurement was done five times or more using a tester (Instron 4444, series IX) under the following conditions: load cell=2 kN, gauge length=75±1 mm, crosshead speed=300±10 mm/min. The results are shown in Table 6 and FIGS. 8a to 8d.

Further, after the conductive layer pattern of each of the samples fixed by a clamp was connected to tips of a multimeter when the tension test was conducted, the resistance of the sample upon tensile deformation was measured in real time.

TABLE 6

| | Cut points | | |
|---|---|---|---|
| Properties | Tensile Strength (kN) | Extended length (mm) | Elongation (%) |
| Comparative example 1-1 | 0.94 | 35.70 | 47.60 |
| Comparative example 1-2 | 0.82 | 44.76 | 59.68 |
| Comparative example 1-3 | 0.86 | 42.16 | 56.21 |
| Comparative example 1-4 | 0.87 | 40.77 | 54.36 |
| Comparative example 1-5 | 0.88 | 49.76 | 66.35 |
| Average | 0.87 | 42.63 | 56.84 |
| Example 7-A-1 | 0.82 | 35.67 | 47.56 |
| Example 7-A-2 | 0.88 | 44.12 | 58.83 |
| Example 7-A-3 | 0.84 | 37.64 | 50.19 |
| Example 7-A-4 | 0.91 | 47.96 | 63.94 |
| Example 7-A-5 | 0.80 | 35.06 | 46.74 |
| Example 7-A-6 | 0.89 | 44.65 | 59.53 |
| Average | 0.86 | 40.85 | 54.46 |
| Example 7-B-1 | 0.88 | 44.54 | 59.38 |
| Example 7-B-2 | 0.86 | 41.06 | 54.74 |
| Example 7-B-3 | 0.88 | 44.98 | 59.97 |
| Example 7-B-4 | 0.90 | 46.19 | 61.58 |
| Example 7-B-5 | 0.82 | 65.67 | 87.55 |
| Example 7-B-6 | 0.90 | 42.09 | 56.12 |
| Example 7-B-7 | 0.84 | 40.10 | 53.46 |
| Example 7-B-8 | 0.82 | 37.09 | 49.45 |
| Average | 0.86 | 45.21 | 60.28 |
| Example 7-C-1 | 0.84 | 38.06 | 50.74 |
| Example 7-C-2 | 0.74 | 27.71 | 36.94 |
| Example 7-C-3 | 0.92 | 46.49 | 61.98 |
| Example 7-C-4 | 0.85 | 39.98 | 53.30 |
| Example 7-C-5 | 0.94 | 49.07 | 65.42 |
| Example 7-C-6 | 0.92 | 48.06 | 64.08 |
| Example 7-C-7 | 0.86 | 88.61 | 118.14 |
| Example 7-C-8 | 0.87 | 73.08 | 97.43 |
| Average | 0.87 | 51.38 | 68.51 |
| Example 7-D-1 | 0.82 | 54.14 | 72.18 |
| Example 7-D-2 | 0.91 | 44.19 | 58.92 |
| Example 7-D-3 | 0.80 | 33.01 | 44.01 |
| Example 7-D-4 | 0.84 | 36.71 | 48.94 |
| Example 7-D-5 | 0.85 | 37.21 | 49.61 |
| Example 7-D-6 | 0.93 | 42.10 | 56.13 |
| Average | 0.86 | 41.22 | 54.97 |
| Total Average | 0.863 | 44.67 | 59.56 |

The results of Table 6 reveal that there was no significant difference in tensile strength and elongation between the conductive fabrics of the respective examples and the conductive fabric of Comparative Example 1. In particular, different conductive layer patterns of the conductive fabric of Example 7 showed similar results in terms of tensile strength and elongation, demonstrating that the conductive layer patterns have little influence on the tensile strength and elongation of the conductive fabrics. These results suggest that free printing is possible in the conductive fabrics, which means that dynamic wearability of the conductive fabrics can be ensured.

FIGS. 13 to 16 is a graph showing variations in the resistance of the parts A, B and C of the conductive fabric fabricated in Example 7 upon tensile deformation. The graph shows that the resistance values were gradually increased as the extended length increased until about 20 mm to about 24 mm and thereafter began to sharply increase. These observations imply that the conductive layer pattern was cut.

Although the present invention has been described herein with reference to the foregoing embodiments and the accompanying drawings, the scope of the present invention is defined by the claims that follow. Accordingly, those skilled in the art will appreciate that various substitutions, modifications and changes are possible, without departing from the spirit of the present invention as disclosed in the accompanying claims. It is to be understood that such substitutions, modifications and changes are within the scope of the present invention.

Particularly, it should, of course, be understood that the conductive fabric of the present invention can be used as a circuit board or a part of an electronic device although smart wear only has been mentioned throughout the specification.

The invention claimed is:

1. A conductive fabric comprising,
   a base layer composed of a synthetic, regenerated or natural fiber that is not impregnated with a resin,
   a conductive layer formed on a surface of the base layer to be capable of being freely formed by a pre-designed electric pattern, and
   an insulating layer formed on the conductive layer to protect the conductive layer from damage.

2. The conductive fabric according to claim 1, further comprising a primer layer formed a surface of the base layer without impregnating the base layer and being disposed between the base layer and the conductive layer to make the surface of the base layer uniform.

3. The conductive fabric according to claim 2, wherein the primer layer is formed of at least one resin selected from the group consisting of polyurethane, acrylic and silicone resins.

4. The conductive fabric according to claim 2, wherein the primer layer is formed in a multilayer structure with a water-repellent layer.

5. The conductive fabric according to claim 1, wherein the conductive layer is formed of at least one material selected from the group consisting of a conductive polymer, carbon, a metal material, and a mixture thereof with a binder.

6. The conductive fabric according to claim 5, wherein the conductive polymer is selected from the group consisting of polyaniline, polypyrrole, polythiophene, and mixtures thereof.

7. The conductive fabric according to claim 5, wherein the metal material and the binder are mixed in a weight ratio of 90:10 to 80:20 to form the conductive layer.

8. The conductive fabric according to claim 5, wherein the binder is selected from the group consisting of polyurethane resins, acrylic resins, silicone resins, melamine resins, epoxy resins, and mixtures thereof.

9. The conductive fabric according to claim 8, wherein the binder is a water-dispersible polyurethane resin.

10. The conductive fabric according to claim 1, wherein the conductive layer has a thickness of 2 μm to 500 μm.

11. The conductive fabric according to claim 10, wherein the conductive layer has a thickness of 10 μm to 20 μm.

12. The conductive fabric according to claim 1, wherein the conductive layer has a width of 10 mm to 20 mm.

13. The conductive fabric according to claim 1, wherein the insulating layer is formed by coating, printing or laminating at least one resin selected from the group consisting of polyurethane, acrylic, silicone, polyester, polyvinyl chloride (PVC) and polytetrafluoroethylene (PTFE) resins on the conductive layer.

14. The conductive fabric according to claim 1, wherein the conductive layer has one or more the enlarged portions of bent portions of a circuit whose width is larger than that of linear portions of the circuit.

15. The conductive fabric according to claim 14, wherein the enlarged portions have a circular or oval shape.

16. The conductive fabric according to claim 1, wherein the conductive fabric has a resistance difference of 0.5Ω to 4Ω before and after washing.

17. A method for fabricating a conductive fabric, the method comprising the steps of
   forming a conductive layer, through which electricity flows, on a surface of a base layer composed of a synthetic, regenerated or natural fiber that is not impregnated with a resin, and
   forming an insulating layer on the conductive layer to protect the conductive layer from damage.

18. The method according to claim 17, further comprising forming a primer layer on a surface of the base layer without impregnating the base layer to maintain the thickness of the conductive layer at a constant level.

19. The method according to claim 18, wherein the primer layer is formed in a multilayer structure with a water-repellent layer.

20. The method according to claim 17, further comprising calendering the base layer using a pressing roller before the formation of the conductive layer to make the surface of the base layer smooth, make up pores of the base layer and enhance the flex resistance of the conductive fabric.

21. The method according to claim 17, further comprising breathable waterproofing/waterproofing the base layer after the calendering step to make up pores of the conductive layer and enhance the insulating properties, wash resistance and flex resistance of the conductive fabric.

22. The method according to claim 18 or 19, wherein the primer layer is formed by knife rolling, over roll coating, floating knife coating, or knife over roll coating.

23. The method according to claim 18 or 19, wherein the primer layer is formed of at least one resin selected from the group consisting of polyurethane, acrylic and silicone resins.

24. The method according to claim 17, wherein the conductive layer is formed of at least one material selected from the group consisting of a conductive polymer, carbon, a metal material, and a mixture thereof with a binder.

25. The method according to claim 24, wherein the conductive polymer is selected from the group consisting of polyaniline, polypyrrole, polythiophene, and mixtures thereof.

26. The method according to claim 24, wherein the metal material and the binder are mixed in a weight ratio of 90:10 to 80:20 to form the conductive layer.

27. The method according to claim 24, wherein the binder is selected from the group consisting of polyurethane resins, acrylic resins, silicone resins, melamine resins, epoxy resins, and mixtures thereof.

28. The method according to claim 27, wherein the binder is a water dispersible polyurethane resin.

29. The method according to claim 17, wherein the conductive layer has a thickness of 2 μm to 500 μm.

30. The method according to claim 29, wherein the conductive layer has a thickness of 10 μm to 20 μm.

31. The method according to claim 17, wherein the conductive layer has a width of 10 mm to 20 mm.

32. The method according to claim 17, wherein the insulating layer is formed by coating, printing or laminating at least one resin selected from the group consisting of polyurethane, acrylic, silicone, polyester, polyvinyl chloride (PVC) and polytetrafluoroethylene (PTFE) resins on the conductive layer.

33. The method according to claim 32, wherein the insulating layer is formed by dry coating, hot-melt dot lamination or gravure lamination.

34. The method according to claim 17, wherein the conductive layer has one or more the enlarged portions of bent portions of a circuit whose width is larger than that of linear portions of the circuit.

35. The method according to claim 34, wherein the enlarged portions have a circular or oval shape.

36. The method according to claim 17, wherein the conductive fabric has a resistance difference of 0.5Ω to 4Ω before and after washing.

* * * * *